United States Patent
Weidenfelder et al.

(10) Patent No.: US 12,320,716 B2
(45) Date of Patent: Jun. 3, 2025

(54) SENSOR ELEMENT AND METHOD FOR PRODUCING A SENSOR ELEMENT

(71) Applicant: TDK Electronics AG, Munich (DE)

(72) Inventors: Anke Weidenfelder, Graz (AT); Jan Ihle, Raaba-Grambach (AT); Bernhard Ostrick, Teltow (DE); Jeffrey Krotosky, Frisco, TX (US)

(73) Assignee: TDK Electronics AG, Munich (DE)

( * ) Notice: Subject to any disclaimer, the term of this patent is extended or adjusted under 35 U.S.C. 154(b) by 297 days.

(21) Appl. No.: 17/639,781

(22) PCT Filed: Aug. 31, 2021

(86) PCT No.: PCT/EP2021/073974
§ 371 (c)(1),
(2) Date: Mar. 2, 2022

(87) PCT Pub. No.: WO2022/049056
PCT Pub. Date: Mar. 10, 2022

(65) Prior Publication Data
US 2022/0357214 A1 Nov. 10, 2022

(30) Foreign Application Priority Data
Sep. 2, 2020 (DE) .......................... 102020122923.2

(51) Int. Cl.
*G01K 7/20* (2006.01)
*B81C 1/00* (2006.01)
*G01K 7/16* (2006.01)

(52) U.S. Cl.
CPC ............ *G01K 7/20* (2013.01); *B81C 1/00888* (2013.01); *G01K 2007/163* (2013.01)

(58) Field of Classification Search
CPC . G01K 7/20; G01K 2007/163; B81C 1/00888
See application file for complete search history.

(56) References Cited

U.S. PATENT DOCUMENTS

| | | | |
|---|---|---|---|
| 4,754,254 A | 6/1988 | Hosokawa et al. | |
| 6,014,073 A * | 1/2000 | Torii | G01K 7/223 338/22 SD |

(Continued)

FOREIGN PATENT DOCUMENTS

| | | |
|---|---|---|
| DE | 102014104219 A1 | 10/2015 |
| DE | 102016200148 A1 | 7/2017 |

(Continued)

*Primary Examiner* — Kyung S Lee
(74) *Attorney, Agent, or Firm* — Slater Matsil, LLP

(57) ABSTRACT

In an embodiment a sensor element includes at least one carrier having a top side and a bottom side, the top side being electrically insulating, at least one functional layer including a material with a temperature-dependent electrical resistance, the functional layer being arranged on the carrier, at least two electrodes arranged on the carrier at a distance from one another and at least two contact pads configured for electrically contacting the sensor element, wherein a respective contact pad is arranged directly on a partial region of one of the electrodes, wherein the sensor element is configured to measure a temperature, and wherein the sensor element is configured for direct integration into an electrical system as a discrete component.

17 Claims, 2 Drawing Sheets

(56) References Cited

U.S. PATENT DOCUMENTS

| | | |
|---|---|---|
| 6,997,040 B1 | 2/2006 | Lee et al. |
| 9,978,484 B2 | 5/2018 | Tanaka et al. |
| 10,529,470 B2 | 1/2020 | Loose et al. |
| 2003/0062984 A1 | 4/2003 | Ito et al. |
| 2004/0161940 A1 | 8/2004 | Daii et al. |
| 2013/0081761 A1 | 4/2013 | Sawada |
| 2015/0055682 A1 | 2/2015 | Nagatomo et al. |
| 2015/0085898 A1 | 3/2015 | Tanaka et al. |
| 2016/0093423 A1 | 3/2016 | Hozoi et al. |
| 2018/0321091 A1 | 11/2018 | Ihle et al. |
| 2022/0357214 A1 | 11/2022 | Weidenfelder et al. |

FOREIGN PATENT DOCUMENTS

| | | |
|---|---|---|
| DE | 102020122923 A1 | 3/2022 |
| JP | H085452 A | 1/1996 |
| JP | H10303004 A | 11/1998 |
| JP | H11224806 A | 8/1999 |
| JP | H11329808 A | 11/1999 |
| JP | 2000208304 A | 7/2000 |
| JP | 2004247443 A | 9/2004 |
| JP | 2008078430 A | 4/2008 |
| JP | 2013084552 A | 5/2013 |
| JP | 2013197367 A | 9/2013 |
| JP | 2013211433 A | 10/2013 |
| JP | 2016090262 A | 5/2016 |
| JP | 2018522461 A | 8/2018 |
| JP | 2020031135 A | 2/2020 |
| WO | 2013147290 A1 | 10/2013 |

\* cited by examiner

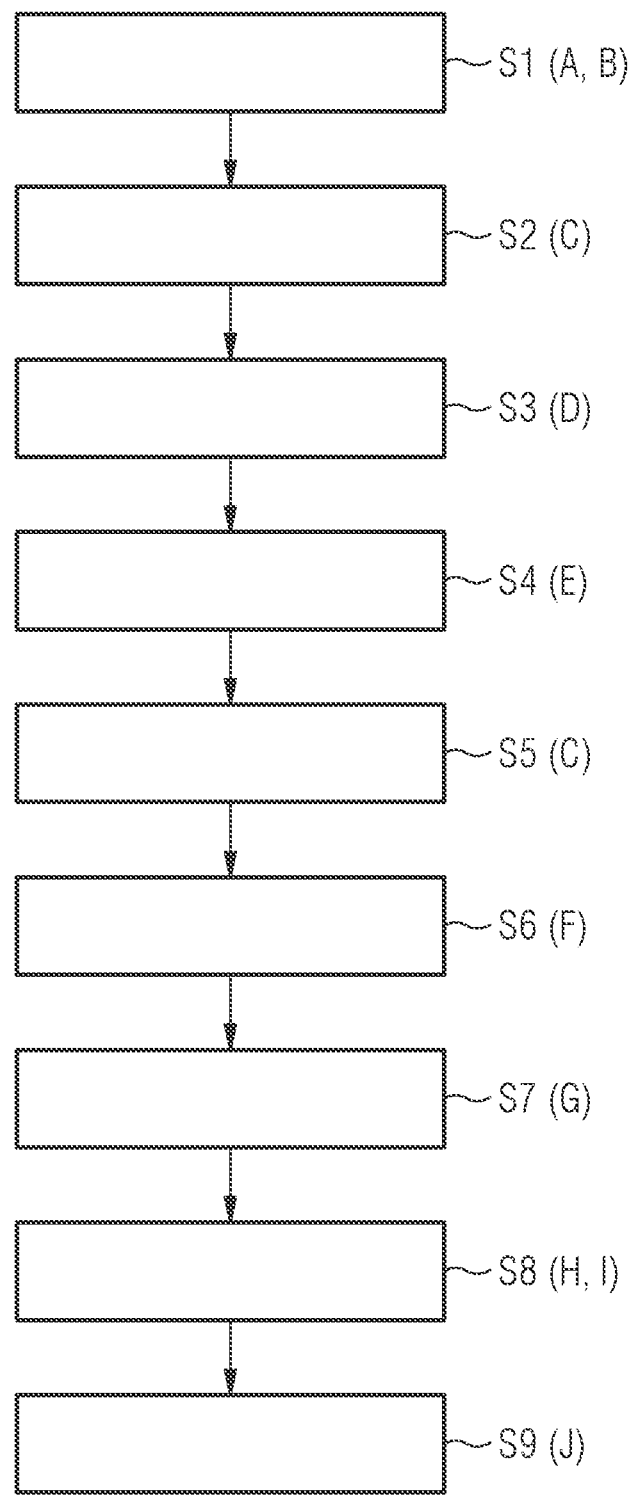

SENSOR ELEMENT AND METHOD FOR PRODUCING A SENSOR ELEMENT

This patent application is a national phase filing under section 371 of PCT/EP2021/073974, filed Aug. 31, 2021, which claims the priority of German patent application 102020122923.2, filed Sep. 2, 2020, each of which is incorporated herein by reference in its entirety.

TECHNICAL FIELD

The present invention relates to a sensor element, in particular a temperature sensor. The present invention further relates to a method for producing a sensor element, preferably a temperature sensor.

BACKGROUND

In order to integrate passive components, such as sensors, condensers, protective components or heaters into electrical systems, the dimensions must be adapted for modern packaging designs, which are in the micrometer and even nanometer scale range. To achieve this degree of miniaturization, the components are deposited as thin films onto carrier structures with electrical connections and described as a discrete device. These novel components can be integrated into MEMS (Micro Electro Mechanical System) or SESUB (Semiconductor Embedded in Substrate) structures.

According to the state of the art, temperatures for monitoring and control in various applications are mainly measured with ceramic thermistors (NTC), silicon temperature sensors (KTY), platinum temperature sensors (PRTD) or thermocouples (TC). Due to the low manufacturing costs, NTC thermistors are the most widely used. A further advantage over thermocouples and metallic resistive elements, such as Pt elements, is their distinct negative resistance-temperature characteristic.

SMD ("surface mounted device") NTC temperature sensors, which are soldered on, are predominantly used for applications in power modules. Alternatively, for low-power control modules, also NTC chips are used which are mounted on the bottom side by means of Ag sintering paste, soldering or bonding, and the top side is contacted via a bonding wire.

These current technical solutions are not suitable for the integration of electronic components in MEMS or SESUB structures, for example. For these systems, very small elements, typically smaller than 500 µm×500 µm×100 µm, are required, which must also be integrable with suitable contacting methods. Particular attention must be paid to the choice of a suitable electrode. The classic soldering methods for SMD designs or wire bonding technologies for semiconductor chips (bare dies) cannot be used for this purpose.

SUMMARY OF THE INVENTION

It is the task of the present invention to describe a sensor element and a method for producing a sensor element which solve the above problems.

This task is solved by a sensor element and a method for producing a sensor element according to the independent claims.

According to one aspect, a sensor element is described. The sensor element 1 is suitable for measuring a temperature. The sensor element is a temperature sensor.

The sensor element comprises at least one carrier. Preferably, the sensor element comprises exactly one carrier. The carrier comprises a carrier material, preferably silicon, silicon carbide or glass (silicate or borosilicate glass). Alternatively, the carrier material may also comprise AlN or $Al_2O_3$.

The carrier has a top side and a bottom side. The top side is electrically insulating. Preferably, an insulating layer, for example $SiO_2$ or $Si_3N_4$, is formed on the top side of the carrier. The insulating layer is formed directly on the top side of the carrier and may be composed of one or more layers.

The sensor element further comprises at least one functional layer. The functional layer is arranged on the carrier. The carrier mechanically stabilizes the functional layer. A thickness of the functional layer is between 50 nm and 1 µm, preferably between 100 nm and 500 nm, particularly preferably between 250 nm and 400 nm.

The functional layer has a material (functional material) that has a special electrical characteristic. The functional layer has a material with a temperature-dependent electrical resistance. Preferably, the functional layer comprises an NTC ceramic.

Preferably, the NTC ceramic is based on an oxidic material in the perovskite or spinel structure type. Alternatively, the functional layer can be based on a carbide or nitride material. Thin films of vanadiumoxide or SiC represent a further alternative.

The sensor element further comprises at least two electrodes. The electrodes are preferably thin-film electrodes. The electrodes are formed on the carrier at a distance from each other. Preferably, the electrodes do not reach to an edge region of the carrier. In particular, the electrodes are preferably formed in a central or inner region on the carrier.

The sensor element further comprises at least two contact pads for electrically contacting the sensor element. Preferably, the sensor element has exactly two contact pads. The contact pads are directly electrically and mechanically connected to the electrodes. One respective contact pad is arranged directly on a partial region of one of the electrodes.

Overall, the sensor element has a very compact design so that it can be embedded directly in an electrical system as a discrete component. For example, the sensor element has a maximum edge length of 1000 µm, preferably <800 µm, particularly preferably <500 µm. A thickness of the sensor element is <100 µm, preferably <80 µm, particularly preferably <50 µm. For example, the component is adapted for direct integration into a MEMS structure and/or into a SESUB structure.

According to one embodiment, the functional layer only partially covers the carrier or the insulating layer on the top side of the carrier. For example, a geometry of the functional layer is selected such that the functional layer covers the carrier/insulating layer only in the area of the finger structure of the electrodes. Preferably, the functional layer is formed only in a central region of the carrier. In particular, the functional layer does not extend to an edge region of the carrier. The geometry or design of the functional layer is selected so that a predetermined resistance of the sensor element can be set with it. This makes the sensor element particularly flexible in use.

According to an embodiment, the respective electrode has an areal end region. The areal end regions of the two electrodes are arranged opposite each other or at a 90° angle to each other. One contact pad each is arranged on the areal end region of one of the electrodes. Furthermore, each electrode has a plurality of electrode fingers. The electrode fingers of the two electrodes are arranged alternately with respect to each other.

The areal end region and the region with the electrode fingers merge directly into one another. A geometry or design of the respective electrode is selected so that a predetermined resistance of the sensor element can be set. In particular, the electrical resistance can be set via length, width and/or number of electrode fingers. The sensor element can thus be adapted to very different requirements and can be used very flexibly.

According to one embodiment, the electrodes are formed directly on a top side of the functional layer. In other words, the functional layer is formed between the electrodes and the carrier. This design allows trimming of the electrode after application and testing of the sensor element. Moreover, in this embodiment, the electrode does not have to withstand the conditions of the sintering process of the functional layer.

According to one embodiment, the electrodes are arranged directly on a bottom side of the functional layer. In other words, the electrodes are formed between the functional layer and the carrier. The formation of the electrode directly on the substrate allows the use of an adhesion promoter (e.g. a thin film <10 nm for better adhesion to the substrate) such as Ti or Cr. This is not possible on the NTC layer, since interactions of the adhesion promoter layer with the NTC material may occur. This is especially true for NTC layers based on an oxidic material in the perovskite or spinel structure type.

According to one embodiment, the contact pads are formed in such a way that they protrude from surface of the sensor element. Preferably, the contact pads protrude ≥1 μm beyond the surface of the sensor element. Preferably, the contact pads protrude >3 μm, more preferably >6 μm beyond the surface of the sensor element. This facilitates the electrical connection of the sensor element.

According to an embodiment, the sensor element has a protective layer. The protective layer can have oxides, nitrides, ceramics, glasses or plastics as the material. The protective layer completely covers a top side of the sensor element with the exception of the contact pads. For this purpose, the protective layer has recesses at the location of the contact pads. The protective layer has a thickness between 50 nm and 1 μm, preferably between 200 nm and 600 nm, ideally between 400 nm and 500 nm. The protective layer improves the long-term stability of the sensor element.

According to a further aspect, a method for producing a sensor element is described. Preferably, the method produces the sensor element described above. All features disclosed with respect to the sensor element or the method are also disclosed correspondingly with respect to the respective other aspect, and vice versa, even if the respective feature is not explicitly mentioned in the context of the respective aspect. The method comprises the following steps:

A) Providing a carrier material for forming a carrier. Preferably, the carrier material comprises Si, SiC or glass. Alternatively, the carrier material may comprise AlN or $Al_2O_3$. The carrier has a top side and a bottom side. Preferably, the carrier material comprises Si.

B) Forming an electrically insulating layer, preferably $SiO_2$, on the top side of the carrier.

C) Formation or deposition of at least two electrodes on the carrier. The deposition is done by a PVD ("physical vapour deposition") process, a CVD ("chemical vapour deposition") process or galvanically and is patterned in a further process step.

The electrodes are formed spaced apart from each other. In particular, the electrodes are spatially and electrically insulated from each other. The electrodes intertwine in the form of interdigital structures. In this embodiment, the electrodes are formed directly on the top side of the carrier or on the insulating layer. The electrodes are formed in such a way that they are spaced from an edge region of the carrier.

D) Application, preferably sputtering, of a functional material to a partial region of the electrodes to form a functional layer. The functional material preferably comprises an NTC ceramic based on an oxidic material in the perovskite or spinel structure type. Alternatively, the functional material can be based on a carbide or a nitride material. Al-ternatively, the functional material may comprise or constitute a thin film of vanadium oxide or SiC.

The functional layer is formed as a thin film layer. The functional layer covers the carrier or the electrodes only partially. In particular, the functional layer is formed so that it is spaced from the edge region of the carrier and is formed on the region of the finger structures (interdigital structures) of the electrode. The functional layer is deposited as a full-surface thin film and only structured in a further process step, e.g. by means of lithography.

After deposition, the NTC layer is not yet crystallized.

E) Sintering of the functional layer. This is used to form the NTC properties of the functional material and is carried out at temperatures of up to 1000 ° C.

F) Application of a protective layer on the top side of the sensor element. The protective layer completely covers the top side except for two partial regions. The partial regions are arranged over the areal end regions of the electrodes, to which the contact pads can be applied in the subsequent process step. For structuring, the protective layer is either
  (a) applied over the entire surface and the free regions are created by a subsequent process such as lithography or laser structuring, or
  (b) directly applied in a structured manner by using a mask during the deposition process.

G) Formation of contact pads in the partial regions free of the protective layer for electrical contacting of the sensor element. In each case, a contact pad is formed directly on the areal end region of one of the electrodes. The contact pads can project beyond the structured functional layer.

The contact pads may comprise Cu, Au, Ni, Cr, Ag, Ti, W, Pd or Pt. Preferably, the contact pads comprise Cu. Preferably, the contact pads have a thickness of >5 μm. The contact pads are designed in such a way that they protrude from a surface of the finished sensor element.

Alternatively to the contact pads, bumps or thin electrodes can be provided. All these possible contact elements have a metal, for example Cu, Au or a solderable alloy.

H) Separation or singulation of the components.
Separation is performed in two steps:
(1) Separating in x-/y-direction (length & width). This can be done for example by plasma etching or sawing and notching of functional layer and carrier. The Si wafer is not sawed through, but only to a defined thickness.
(2) Separation in z-direction (height). Grinding is done from the backside. By means of a grinding process, material is removed from the bottom side of the Si wafer to a defined final component thickness.
For this purpose take place a
I) Grinding of the sensor elements from the bottom side, whereby material is removed by a grinding process from the back side of the Si-wafer down to a defined final component thickness, whereby the components are separated.

J) optional plasma etching of the ground down bottom side of the Si-wafer to reduce for example microcracks.

According to one embodiment, step D) can be carried out before step C). In this case, the functional layer is first formed on a partial region of the carrier. Then the electrodes are deposited. The electrodes are formed directly on a top side of the functional layer.

BRIEF DESCRIPTION OF THE DRAWINGS

The drawings described below are not intended to be to scale. Rather, individual dimensions may be enlarged, reduced or even distorted for better representation.

Elements which are similar or which perform the same function are designated with the same reference signs.

Figure 1:
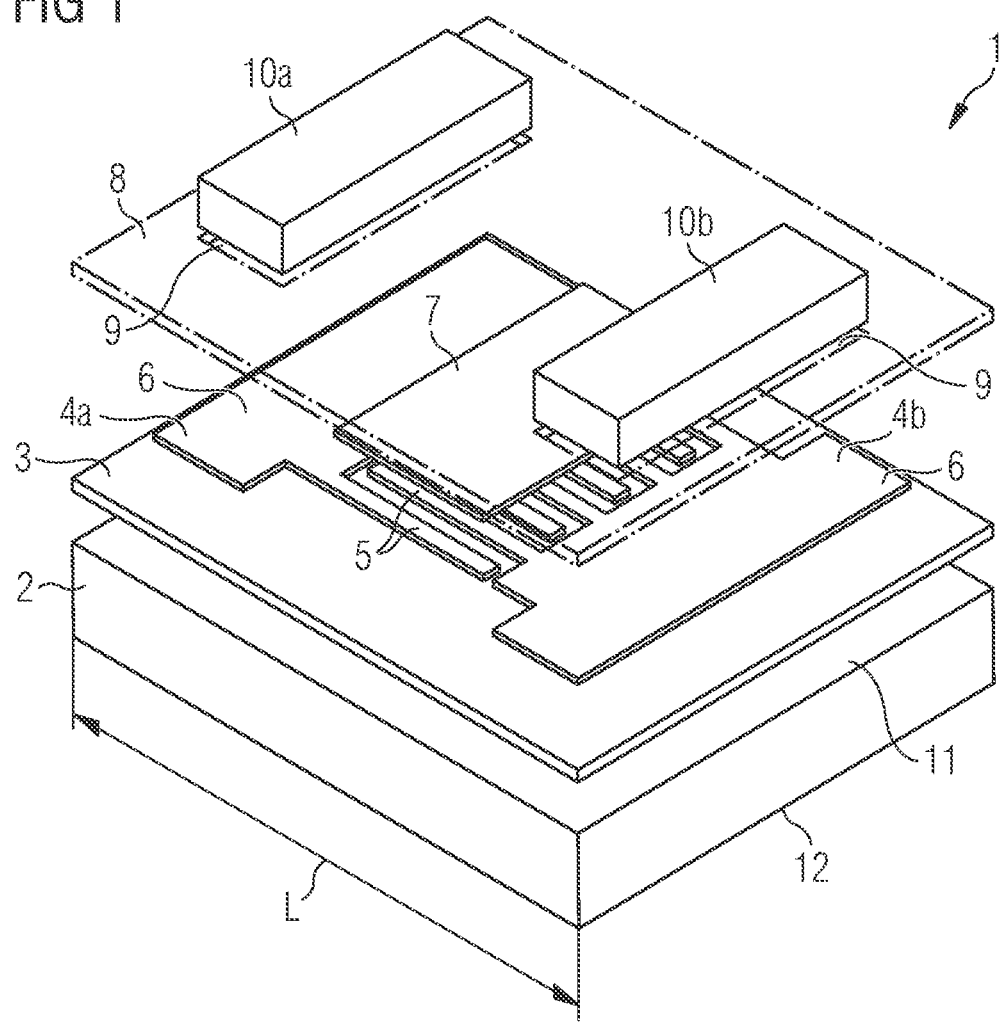
Figure 2:
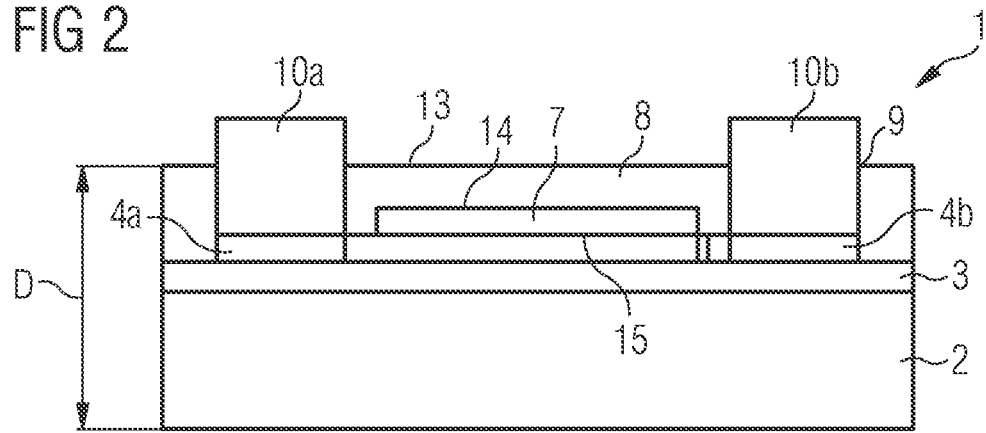

It shows:

FIG. 1 a perspective view of a sensor element according to an embodiment,

FIG. 2 a sectional view of a sensor element according to the embodiment in FIG. 1, FIG. 3 a process flow of the manufacturing method.

DETAILED DESCRIPTION OF ILLUSTRATIVE EMBODIMENTS

FIGS. 1 and 2 show a representation of a sensor element 1 according to an embodiment. The sensor element 1 is preferably designed for measuring a temperature. The sensor element 1 is a temperature sensor. The sensor element 1 has a very compact design. A thickness D of the sensor element (see FIG. 2) is preferably <100 μm, preferably <80 μm, particularly preferably <50 μm. Therefore, the sensor element 1 is particularly well suited to be embedded directly in an electrical system as a discrete component. For example, the sensor element 1 is designed for direct integration into a MEMS structure and/or into a SESUB structure.

The sensor element 1 has a carrier 2. The carrier 2 serves to mechanically stabilize the sensor element 1. The carrier 2 has a top side 11 and a bottom side 12. The top side 11 and the bottom side 12 are arranged opposite each other.

The carrier 2 has a carrier material, preferably silicon (Si), silicon carbide (SiC) or glass (silicate or borosilicate). In an alternative embodiment, the carrier 2 has AlN or $Al_2O_3$ as the carrier material.

The top side 11 of the carrier 2 is electrically insulating. In other words, an insulating layer 3 is formed on the top side 11 of the carrier 2. For a carrier 2 made of silicon, for example, an insulating layer 3 comprising $SiO_2$ is applied directly to the top side 11 of the carrier 2.

The insulating layer 3 has a very small thickness. The thickness of the insulating layer 3 is between 50 nm and 1 μm, preferably between 250 nm and 600 nm. Particularly preferably, the insulating layer 3 has a thickness of 500 nm.

The carrier 2 preferably has a rectangular base area. Alternatively, the carrier 2 can also be square. A maximum edge length L of the carrier 2 is 1000 μm in both cases. Preferably, the edge length L of the carrier 2 is <800 μm, particularly preferably <500 μm.

The sensor element 1 further comprises at least two electrodes 4a, 4b for electrical contacting of the sensor element 1. Alternatively, the sensor element 1 may have more than two electrodes 4a, 4b, for example three or four electrodes (not explicitly shown).

The two electrodes 4a, 4b are formed spaced apart from each other on the carrier 2. The respective electrode 4a, 4b may have a single-layer or multilayer structure. The respective electrode 4a, 4b comprises thin metal films, for example comprising Cu, Au, Ni, Cr, Ag, Ti, W, Pd or Pt. Preferably, the electrodes 4a, 4b are designed as thin film electrodes. In particular, the electrodes 4a, 4b are formed as interdigitated thin film electrodes, as described in detail below.

The respective electrode 4a, 4b is formed in a structured manner. In particular, the electrodes 4a, 4b each have an areal end region 6 and a region with electrode fingers 5. In this embodiment, the areal end region 6 of the respective electrode 4a, 4b is formed closer to a side region or to an edge of the carrier 2 than the region with the electrode fingers 5. However, both regions (end region 6 and electrode fingers 5) are preferably arranged at a distance from the edge of the carrier 2. The areal end regions 6 of the two electrodes 4a, 4b can be arranged opposite each other or at a 90° angle to each other.

In this embodiment, the region with the electrode fingers 5 is formed in a central area of the carrier 2, respectively. The areal end region 6 and the region with the electrode fingers 5 merge into one another.

The two electrodes 4a, 4b intertwine with each other in the region of the electrode fingers 5 in the central area of the carrier and form an interdigital structure there. The electrode fingers 5 of the electrodes 4a, 4b are arranged alternately. The electrical resistance of the sensor element 1 can be adjusted via the length, width and/or number of the electrode fingers 5, as well as their distance from each other.

In this embodiment, the electrodes 4a, 4b are formed directly on the top side 11 of the carrier 2 or the insulating layer 3. Alternatively (not explicitly shown), however, the electrodes 4a, 4b may also be formed on the top side 14 of a functional layer 7, as will be explained later.

The sensor element 1 further comprises a functional layer 7.

The functional layer 7 has a material with a specific electrical characteristic. The functional layer 7 has a material with a temperature-dependent electrical resistance. The functional layer 7 preferably comprises an NTC ceramic.

For example, the functional layer 7 has a ceramic based on an oxidic material in the perovskite structure type. For example, the perovskite is based on solid solutions of the composition $CaMnO_3$, in which Ca may be wholly or partially replaced by, for example, Y, Cr, Al or La.

Alternatively, the functional layer 7 may comprise a ceramic based on a spinel structure type oxidic material. The composition of the spinel is preferably based on solid solutions of $NiMn2O_4$, in which Ni and Mn can be replaced in whole or in part with, for example, Fe, Co, Al.

Also conceivable are functional layers 7 based on vanadium oxide, a carbidic material, for example hexagonal (Si, Ti)C, 2H, 4H or 6H, cubic SiC or based on a nitride material, for example (Al,Ti)N, CrN.

The functional layer 7 is preferably a thin film layer. In other words, the functional layer 7 has only a very small thickness. The thickness of the functional layer 7 is between 50 nm and 1 μm. Preferably, the thickness of the functional layer 7 is between 100 nm and 500 nm, particularly preferably between 250 nm and 400 nm.

The functional layer 7 only partially covers the top side 11 of the carrier 2. In other words, the functional layer 7 is not arranged over the entire surface of the carrier 2. A geometry and/or a design of the functional layer 7 is selected such that a specific resistance value of the sensor element 1 can be set therewith.

In one embodiment (not explicitly shown), the functional layer 7 is formed directly on the insulating layer 3 and thus below the electrodes 4a, 4b, for example sputtered on. In other words, the functional layer 7 is formed between the carrier 2 and the electrodes 4a, 4b. In this embodiment, the functional layer 7 is arranged on the carrier 2 in a form-fit and material-fit manner. Alternatively, the functional layer 7 is generated directly in the carrier material locally or as a layer.

For particularly tightly toleranced resistances at nominal temperature, the resistance of the sensor element 1 can be adjusted in this design with an additional trimming process. In this process, material of the electrodes 4a, 4b is partially removed by, for example, laser cutting, grinding or sawing in such a way that the resistance of the sensor element 1 is adjusted by the change in geometry.

Alternatively (see FIGS. 1 and 2), the functional layer 7 is at least partially applied to the electrodes 4a, 4b, in particular sputtered on. As can be seen from FIGS. 1 and 2, the electrodes 4a, 4b are formed between the carrier 2 and the functional layer 7, in particular on a bottom side 15 of the functional layer 7. Thereby, the functional layer 7 rests directly on the region with the electrode fingers 5.

The sensor element 1 further has at least two contact pads 10a, 10b. The sensor element 1 can also have more than two contact pads, for example three or four contact pads. The contact pads 10a, 10b are adapted and arranged for electrical contacting of the sensor element 1.

The contact pads 10a, 10b are arranged directly on the areal end regions 6 of the electrodes 4a, 4b. The contact pads 10a, 10b can have a single-layer or multilayer structure. For example, Cu, Au, Ni, Cr, Ag, Ti, W, Pd or Pt can be used as materials for the contact pads 10a, 10b.

The contact pads 10a, 10b have a thickness of >400 nm, advantageously >1 μm, particularly preferably >5 μm. For integration into a SESUB structure, the contact pads 10a, 10b preferably comprise copper. In particular, the contact pads 10a, 10b are made of Cu.

The thickness of the Cu contact pads 10a, 10b is such that the contact pads 10a, 10b protrude from a surface 13 of the sensor element 1 (see in particular FIG. 2). The Cu contact pads 10a, 10b protrude at least 1 μm, preferably >3 μm, ideally >6 μm beyond the surface 13. This thickness of the Cu contact pads 10a, 10b is required for further processing in the SESUB structure in order to establish a reliable electrical connection.

The sensor element 1 may further have a protective layer 8. The protective layer 8 serves to improve the long-term stability of the sensor element 1. The protective layer 8 comprises a non-conductive material, comprising for example oxides, nitrides, ceramics, glasses or plastics, and may consist of one or more layers.

The protective layer 8 completely covers a top side of the sensor element 1 with the exception of the contact pads 10a, 10b. In particular, the protective layer 8 has recesses 9 from which the contact pads 10a, 10b protrude for electrical contacting of the sensor element 1.

The protective layer 8 is produced by a PVD or CVD process and structured by means of lithography. A thickness of the protective layer 8 is between 50 nm and 1 μm. Preferably, the thickness of the protective layer 8 is between 200 nm and 600 nm, particularly preferably between 400 nm and 500 nm.

Due to the compact design of the individual components of the sensor element 1, the sensor element 1 is excellently suited for integration in MEMS or SESUB structures.

In the following, a method for producing a sensor element 1 is described. Preferably, the method manufactures the sensor element 1 according to any one of the embodiments described above. All the features described in connection with the sensor element 1 are therefore also applicable to the method and vice versa.

In a first step A), a carrier material is provided for forming the carrier 2 described above. Preferably, the carrier material has Si, SiC or glass. Alternatively, the carrier material may comprise AlN or $Al_2O_3$. The carrier 2 has a top side 11 and a bottom side 12. Preferably, the carrier 2 has a maximum edge length L of less than 500 μm.

In a next step B), an electrically insulating layer 3 is formed on the top side 11 of the carrier 2. For example, the insulating layer 3 has $SiO_2$. Ideally, an insulating layer 3 with a thickness of 500 nm is formed on the top side 11 of the carrier 2.

In a further step C), the formation/deposition of at least two electrodes 4a, 4b on the carrier 2 takes place. The deposition is carried out by a PVD or CVD process or galvanically. The structuring of the electrodes takes place in a subsequent process, this can be for example a lithography process or laser structuring. In this embodiment, the electrodes 4a, 4b are formed directly on the insulating layer 3.

The electrodes 4a, 4b can be formed in a single layer or in multiple layers and have for example Cu, Au, Ni, Cr, Ag, Ti, W, Pd or Pt. The electrodes 4a, 4b are formed as thin film electrodes. The electrodes 4a, 4b have a structured design and each have an areal end region 6 and a plurality of electrode fingers 5. The resistance of the sensor element can be adjusted by the geometry or design of the electrodes 4a, 4b.

In a further step D), a functional material is applied to form a functional layer 7. In this embodiment, the functional material is applied to a partial region of the electrodes 4a, 4b. This is done, for example, by sputtering or a spin-coating process. The functional material is first applied over the entire surface and then structured in a further process (for example lithography or laser structuring).

Alternatively, step D) can also be carried out before step C), so that the functional material 7 is sputtered directly onto the insulating layer 3 of the carrier 2 and then the electrodes 4a, 4b are applied to the functional layer 7.

The functional material preferably comprises an NTC ceramic based on an oxidic material in the perovskite or spinel structure type. Alternatively, the functional material may also comprise an NTC ceramic based on a carbide or a nitride type material. In another alternative, the functional material comprises or consists of thin films of vanadium oxide or SiC.

The functional layer 7 only partially covers the top side of the carrier 2 or the electrodes 4a, 4b. The resistance of the sensor element 1 can be adjusted by the geometry or design of the functional layer 7. Preferably, the functional layer 7 has a thickness between 250 nm and 400 nm.

In a further step E), contact pads 100a, 10b are formed on at least a partial region of the electrodes 4a, 4b. In each case, a contact pad 10a, 10b is formed directly on the areal end region 6 of an electrode 4a, 4b.

Preferably, the contact pads 10a, 10b have Cu and a thickness of >5 μm. In particular, in the finished sensor element 1, the contact pads 10a, 10b protrude from the surface 13 of the sensor element 1. Alternatively, bumps can be formed instead of the contact pads.

In a next step G), a protective layer 8 is formed. The protective layer 8 may comprise oxides, nitrides, ceramics or glasses and is generated by a PVD or CVD process and patterned by lithography. Ideally, the protective layer 8 has a thickness between 400 nm and 500 nm and completely covers the top side of the sensor element 1 with the exception of the contact pads 10a, 10b.

In a further step H), the sensor elements are separated. This can be done, for example, by plasma etching or sawing and notching of the functional layer 7 and carrier 2. The Si-wafer is not sawn through, but only to a defined thickness.

In a final step I), material is removed from the back of the Si wafer to a defined final component thickness by subsequent grinding from the back (a grinding process). This step results in the actual separation of the components.

FIG. 3 shows a process flow of the manufacturing process. The process is divided into eight stages S1 to S8, each of which can comprise several of the method steps A) to J) described above. The steps comprise;

S1 Provision of an Si wafer according to steps A) and B)
S2 Deposition and patterning of the electrode according to step C)
S3 Deposition and patterning of the functional layer according to step D)
S4 Sintering of the functional layer to produce the NTC properties according to step E)
S5 Deposition and structuring of the electrode as in stage S2 or corresponding to method step C). Stage S5 is alternative to stage S2, which can be omitted in this case. Thus, either stage S2 or S5 is used.
S6 Deposition and structuring of the passivation layer according to step F)
S7 Deposition and structuring of the contact pads according to step G)
S8 Separation of the individual sensor elements according to steps H) and I)
S9 Optional re-grinding of the sensor elements from the bottom side and optional plasma etching.

The description of the objects disclosed herein is not limited to the individual specific embodiments. Rather, the features of the individual embodiments can be combined with each other in any way—as far as this makes technical sense.

The invention claimed is:

1. A sensor element comprising:
at least one carrier having a top side and a bottom side, the top side being electrically insulating;
at least one functional layer comprising a material with a temperature-dependent electrical resistance, the functional layer being arranged on the carrier;
at least two electrodes arranged on the carrier at a distance from one another, wherein each electrode has a plurality of electrode fingers, and wherein the electrode fingers of the two electrodes are arranged alternately with respect to each other; and
at least two contact pads configured for electrically contacting the sensor element,
wherein a respective contact pad is arranged directly on a partial region of one of the at least two electrodes,
wherein the functional layer comprises an NTC ceramic based on an oxidic material in a perovskite structure type or a spinel structure type, or wherein the functional layer comprises an NTC ceramic based on a carbide or a nitride material, or wherein the functional layer comprises a thin layer of vanadium oxide or SiC,
wherein the sensor element is configured to measure a temperature, and
wherein the sensor element is configured for direct integration into an electrical system as a discrete component.

2. The sensor element according to claim 1, wherein the functional layer only partially covers the top side of the carrier.

3. The sensor element according to claim 1, further comprising an insulating layer located directly on the top side of the carrier.

4. The sensor element according to claim 1, wherein the at least two electrodes are thin-film electrodes.

5. The sensor element according to claim 1, wherein a respective electrode has an areal end region, and wherein the respective contact pad is arranged on the areal end region of the respective electrode.

6. The sensor element according to claim 1, wherein the at least two electrodes are arranged directly on a top side of the functional layer.

7. The sensor element according to claim 1, wherein the at least two electrodes are arranged directly on a bottom side of the functional layer.

8. The sensor element according to claim 1, wherein the at least two contact pads protrude from a surface of the sensor element.

9. The sensor element according to claim 1, further comprising a protective layer completely covering a top side of the sensor element except for the at least two contact pads.

10. The sensor element according to claim 1, wherein the carrier comprises silicon, silicon carbide or glass.

11. The sensor element according to claim 1, wherein a thickness of the sensor element is <100 μm.

12. The sensor element according to claim 1, wherein the sensor element is designed for direct integration into a MEMS structure and/or into a SESUB structure.

13. The sensor element according to claim 1, wherein a resistance of the sensor element is adjusted by a geometry of the functional layer and/or the at least two electrodes.

14. The sensor element according to claim 1, wherein the carrier comprises AlN or $Al_2O_3$ as a carrier material.

15. A method for producing a sensor element, the method comprising:
providing a carrier material for forming a carrier;
forming an electrically insulating layer on a top side of the carrier;
forming at least two electrodes on the carrier;
applying a functional material to a partial region of the at least two electrodes to form a functional layer;
sintering the functional layer;
applying a protective layer to a top side of the sensor element, the protective layer completely covering the top side except for two partial regions, the partial regions being arranged over areal end regions of the at least two electrodes to which contact pads are subsequently applicable;
forming the contact pads in the partial regions free of the protective layer for electrical contacting of the sensor element;
separating sensor elements by sawing with a diamond saw or by plasma etching so that components are not yet finally separated;
grinding the sensor elements from a bottom side, wherein a material is removed from a back side of the carrier to a defined final component thickness by grinding, wherein the carrier is a Si-wafer, and wherein the components are separated; and
optionally plasma etching of the bottom side of the Si-wafer to reduce micro-cracks.

16. The method according to claim 15, wherein applying the functional material is carried out before forming the at least two electrodes, and wherein the at least two electrodes are formed directly on a top side of the functional layer.

17. A sensor element comprising:
at least one carrier having a top side and a bottom side, the top side being electrically insulating;
at least one functional layer comprising a material with a temperature-dependent electrical resistance, the functional layer being arranged on the carrier;
at least two electrodes arranged on the carrier at a distance from one another, wherein each electrode has a plurality of electrode fingers, and wherein the electrode fingers of the two electrodes are arranged alternately with respect to each other; and
at least two contact pads configured for electrically contacting the sensor element,
wherein a respective contact pad is arranged directly on a partial region of one of the at least two electrodes,
wherein the at least two electrodes are arranged directly on a bottom side of the functional layer,
wherein the sensor element is configured to measure a temperature,
wherein the sensor element is configured for direct integration into an electrical system as a discrete component, and
wherein the sensor element is designed for direct integration into a MEMS structure and/or into a SESUB structure.

* * * * *